(12) United States Patent
Lee et al.

(10) Patent No.: US 12,265,135 B2
(45) Date of Patent: Apr. 1, 2025

(54) BATTERY MONITORING DATA MANAGEMENT DEVICE AND METHOD

(71) Applicant: SK Signet Inc., Jeollanam-do (KR)

(72) Inventors: Min Kyu Lee, Gyeonggi-do (KR); Dong Hun Kim, Seongnam-si (KR); Hyun Mook Kang, Suwon-si (KR)

(73) Assignee: SK Signet Inc., Yeonggwang-gun (KR)

( * ) Notice: Subject to any disclaimer, the term of this patent is extended or adjusted under 35 U.S.C. 154(b) by 0 days.

(21) Appl. No.: 18/762,722

(22) Filed: Jul. 3, 2024

(65) Prior Publication Data
US 2025/0012871 A1   Jan. 9, 2025

(30) Foreign Application Priority Data
Jul. 3, 2023 (KR) .................. 10-2023-0086077

(51) Int. Cl.
| | | |
|---|---|---|
| *G06F 11/30* | (2006.01) | |
| *G01R 31/36* | (2020.01) | |
| *G01R 31/367* | (2019.01) | |
| *G01R 31/396* | (2019.01) | |

(52) U.S. Cl.
CPC ....... *G01R 31/396* (2019.01); *G01R 31/3646* (2019.01); *G01R 31/367* (2019.01)

(58) Field of Classification Search
CPC .................................................. G01R 31/396
See application file for complete search history.

(56) References Cited

FOREIGN PATENT DOCUMENTS

| | | | |
|---|---|---|---|
| JP | 2005-223718 A | | 8/2005 |
| JP | 2005223718 | * | 8/2005 |
| KR | 10-2012-0131560 A | | 12/2012 |
| KR | 10-2013-0066283 | | 6/2013 |
| KR | 10-1663579 | | 9/2016 |
| KR | 10-2019-0093405 A | | 8/2019 |
| KR | 10-2107731 B1 | | 5/2020 |
| KR | 10-2021-0023446 A | | 3/2021 |
| KR | 20210023446 | * | 3/2021 |
| KR | 10-2021-0047444 A | | 4/2021 |
| KR | 10-2023-0057875 A | | 5/2021 |

(Continued)

OTHER PUBLICATIONS

Korean Patent Office, Office Action Issued on Nov. 25, 2023.
(Continued)

*Primary Examiner* — Phuong Huynh
(74) *Attorney, Agent, or Firm* — ZION IP; Byungwoong Park

(57) ABSTRACT

The present disclosure discloses a battery monitoring data management system. According to an embodiment, the system may comprise charge-discharge apparatuses to be connected to batteries and to collect state information of the batteries; charge-discharge apparatus controllers to control the charge-discharge apparatuses and to generate monitoring data from the collected state information; and a monitoring data management device to receive monitoring data generated by the charge-discharge apparatus controllers, to create message groups based on the received monitoring data, to extract alarm data from the message groups, to generate alarm messages based the extracted alarm data, and to transmit the generated alarm messages to at least one of a monitoring server and an administrator terminal.

10 Claims, 11 Drawing Sheets

(56) References Cited

FOREIGN PATENT DOCUMENTS

| | | | |
|---|---|---|---|
| KR | 10-2273703 | | 6/2021 |
| KR | 10-2022-0045497 A | | 4/2022 |
| KR | 2022045497 | * | 4/2022 |
| KR | 10-2484196 B1 | | 1/2023 |
| KR | 20230057875 | * | 5/2023 |
| KR | 10-2646874 B1 | | 3/2024 |

OTHER PUBLICATIONS

Korean Patent Office, Notice of Allowance Issued on Jan. 7, 2024.
International Search Report for PCT/KR2024/007942, dated Sep. 13, 2024.

* cited by examiner

| Equipment number | Channel NO | Alarm code |
|---|---|---|
| 192.168.0.1 | 1 | X |

BATTERY MONITORING DATA MANAGEMENT DEVICE AND METHOD

CROSS REFERENCE TO RELATED APPLICATION

This application claims the priority to Korea Patent Application No. 10-2023-0086077, filed on Jul. 3, 2023, the entire disclosure of which is hereby incorporated herein by reference in its entirety.

FIELD OF TECHNOLOGY

The present disclosure relates to a battery monitoring data management device and method. More specifically, it relates to a device and a method for managing monitoring data for a great quantity of batteries without loss.

BACKGROUND

Recently, as electric vehicles reach mass adoption, necessities for management of batteries, which are core asset of electric vehicle owners are being on the rise. Besides, attention to the availability of batteries as energy storing devices as well as the waste battery recycling industry increases.

Currently, battery manufacturers store long-term battery test data in a monitoring server of individual equipment. In this case, when there is any problem in the monitoring server, monitoring results cannot be delivered to an administrator's terminal and long-term battery test data could be lost. In particular, as great volume of data is collected from multiple battery manufacturers and a great number of batteries and managed, problems in the monitoring server cause a great risk.

For such a reason, when managing monitoring data for batteries, distributed processing of the monitoring data through flexible message exchanges is required, rather than a structure where data is focused on a monitoring server.

The discussions in this section are only to provide background information and do not constitute an admission of prior art.

DOCUMENTS OF PRIOR ARTS

Patent Document

Reference 0001: Korean Patent Publication No. KR 1663579

SUMMARY

The present disclosure is to provide a device and a method for efficiently managing great volume of monitoring data for batteries without loss.

Specifically, aspects of the present disclosure provide a device and a method which can maintain control over battery charge-discharge apparatuses by controlling battery charge-discharge apparatuses using multiple battery charge-discharge apparatus control units.

Aspects of the present disclosure provide a device and a method to acquire monitoring data through various channels, not through a single path by collecting monitoring data using sensor devices as well in addition to battery charge-discharge apparatuses.

Aspects of the present disclosure provide a device and a method to message battery monitoring result data to multiple recipients so that even if one recipient has a problem, other recipients may record data.

Aspects of the present disclosure provide a device and a method in which an entire monitoring data management system may conduct simulations by updating simulation data solely in a monitoring data management device even if simulation data is not individually inputted and stored in every charge-discharge apparatus or every control unit of a charge-discharge apparatus.

Aspects of the present disclosure provide a device and a method to generate monitoring data for batteries in environments different from each other by providing different kinds of simulation data to control units of different charge-discharge apparatus for generating battery monitoring data for learning.

Technological aspects of the present disclosure are not limited to the above-described ones. Other technological aspects, which are not described above, should be more clearly understood by a person having ordinary skill in the art based on the following description.

To achieve the above aspects, an embodiment of the present disclosure provides a battery monitoring data management system comprising: charge-discharge apparatuses to be connected to batteries and to collect state information of the batteries; charge-discharge apparatus controllers to control the charge-discharge apparatuses and to generate monitoring data from the collected state information; and a monitoring data management device to receive monitoring data generated by the charge-discharge apparatus controllers, to create message groups based on the received monitoring data, to extract alarm data from the message groups, to generate alarm messages based the extracted alarm data, and to transmit the generated alarm messages to at least one of a monitoring server and an administrator terminal.

According to an embodiment, the monitoring data management device may transmit a control message for collecting state information of the batteries to a first charge-discharge apparatus controller and control the first charge-discharge apparatus controller that operates by the control message, wherein the first charge-discharge apparatus controller may collect first stat information and second state information of a battery to be measured from at least one charge-discharge apparatus and may generate state monitoring data corresponding to the first state information and state monitoring data corresponding to the second state information.

According to an embodiment, the battery monitoring data management system may further comprise sensor devices to be installed in an environment for battery tests and to collect battery test environment information and sensor device controllers to control the sensor devices and to generate monitoring data from the collected environment information.

According to an embodiment, the monitoring data management device may transmit a control message for collecting the battery test environment information to a first sensor device controller and control the first sensor device controller that operates by the control message, wherein the first sensor device controller may collect, from at least one sensor device, first environment information and second environment information when testing a battery to be measured and generate environment monitoring data corresponding to the first environment information and environment monitoring data corresponding to the second environment information.

According to an embodiment, the monitoring data management device may create at least one message group based on the state monitoring data and the environment monitoring data, wherein a name of the message group may be generated by at least one of the charge-discharge apparatus controllers, the charge-discharge apparatuses, the sensor device controllers, and the sensor devices.

According to an embodiment, the monitoring data management device may extract alarm data from the at least one message group according to a predetermined criterion, wherein, when there exist duplicate pieces of alarm data among the extracted alarm data, an alarm message is generated based on a first piece of alarm data among the duplicate pieces of alarm data, and the generated alarm message may be transmitted to at least one of the monitoring server and the administrator terminal.

According to an embodiment, the monitoring data management device may determine whether a time interval between the reception of the first piece of alarm data and the reception of a second piece of alarm data, among the duplicate pieces of alarm data, exceeds a predetermined threshold value. When the time interval exceeds the predetermined threshold value, the monitoring data management device may classify the second piece of alarm data as new alarm data, generate an alarm message based on the second piece of alarm data, and transmit the generated alarm message to at least one of the monitoring server and the administrator terminal.

According to an embodiment, the monitoring data management device may determine whether a time interval between the reception of the first piece of alarm data and the reception of a second piece of alarm data, among the duplicate pieces of alarm data, exceeds a predetermined threshold value. When the time interval does not exceed the predetermined threshold value, the monitoring data management device may filter the second piece of alarm data as duplicate alarm data, and store an alarm message, generated based on the duplicate alarm data, in the monitoring data management device or transmit it only to the monitoring server.

According to an embodiment, the monitoring data management device may generate an alarm message based on the first piece of alarm data, wherein the monitoring data management device may identify a predetermined code in the first piece of alarm data, designate a storage path for the alarm data based on the identified code, and transmit the generated alarm message to at least one of the monitoring server and the administrator terminal based on the designated storage path.

According to an embodiment, when transmitting a control message for collecting the state information of batteries to a first charge-discharge apparatus controller, and then, not receiving any response message from the first charge-discharge apparatus controller, the monitoring data management device may change a path for collecting state information by changing control authority for the charge-discharge apparatuses, that collect battery state information, from the first charge-discharge apparatus controller to a second charge-discharge apparatus controller.

According to an embodiment, when transmitting a control message for collecting the battery test environment information to a first sensor device controller, and then, not receiving any response message from the first sensor device controller, the monitoring data management device may change a path for collecting environment information by changing control authority for the sensor devices, that collect battery test environment information, from the first sensor device controller to a second sensor device controller.

According to an embodiment, the monitoring data management device may classify the charge-discharge apparatuses into a first charge-discharge apparatus group and a second charge-discharge apparatus group and may transmit first simulation data for virtual tests for batteries connected to the first charge-discharge apparatus group to a first charge-discharge apparatus controller, among the charge-discharge apparatus controllers, that controls the first charge-discharge apparatus group and second simulation data for virtual tests for batteries connected to the second charge-discharge apparatus group to a second charge-discharge apparatus controller, among the charge-discharge apparatus controllers, that controls the second charge-discharge apparatus group.

According to an embodiment, the battery monitoring data management system may further comprise at least one of the monitoring server and the administrator terminal, and the monitoring data management device may receive the first simulation data and the second simulation data from at least one of the monitoring server and the administrator terminal.

To achieve the above aspects, another embodiment of the present disclosure provides a battery monitoring data management method, performed by a battery monitoring data management device, comprising: transmitting charge-discharge apparatus control messages to charge-discharge apparatus controllers; collecting, from the charge-discharge apparatus controllers, state information of batteries measured by charge-discharge apparatuses controlled by the charge-discharge apparatus controllers; generating monitoring data based on the state information; creating message groups for the monitoring data; extracting alarm data from the message groups according to a predetermined criterion; generating alarm messages based on the alarm data; and transmitting the alarm messages to at least one of a monitoring server and an administrator terminal.

To achieve the above aspects, another embodiment of the present disclosure provides a battery monitoring data management device, comprising: at least one processor; a network interface to collect state information of batteries; a memory to load a computer program executed by the processor; and a storage to store the computer program and monitoring data, wherein the computer program may comprise an operation of transmitting a control message for charge-discharge apparatuses to charge-discharge apparatus controllers; an operation of collecting, from the charge-discharge apparatus controllers, state information of batteries measured by the charge-discharge apparatuses controlled by the charge-discharge apparatus controllers; an operation of generating monitoring data based on the state information; an operation of creating message groups for the monitoring data; an operation of extracting alarm data from the message groups according to a predetermined criterion; an operation of generating an alarm message based on the alarm data; and an operation of transmitting the alarm message to at least one of a monitoring server and an administrator terminal.

A battery monitoring device according to the embodiments of the present disclosure has an advantage of providing the efficiency and predictivity in battery management of an electric vehicle owner by monitoring state information of battery cells.

A battery monitoring system according to the embodiments of the present disclosure can monitor battery states through feedback data provided from batteries supplied with currents and can determine influences of sensed external environment data on the charge-discharge of batteries.

According to the embodiments, assessments for batteries become more accurate and it is possible to predict the battery states and the change in battery life, depending on external environmental factors, in addition to identifying the current state of a battery.

Additionally, according to the embodiments, advantageously, various battery environments can be measured and simulations for various battery environments can be conducted, by setting current supplies and setting external environment data values.

A battery monitoring method according to the embodiments of the present disclosure has an advantage that, although one of charge-discharge apparatus control units has a problem, battery data can be managed and the control authority for charge-discharge apparatuses can be secured, by operating the other charge-discharge apparatus control units. In addition, since different simulation data is provided to multiple charge-discharge apparatus control units, it is easy to generate monitoring data for learning.

A battery monitoring method according to the embodiments of the present disclosure, in particular, has an advantage that, since monitoring results are messaged to multiple recipients, even when there is any reception failure or data loss in any one recipient, the monitoring results can be loaded in the other recipients.

Effects of the present disclosure are not limited to the aforementioned effects and other effects, which are not described above, would be clearly understood by a person with ordinary skill in the art based on the following description.

BRIEF DESCRIPTION OF THE DRAWINGS

In order that the disclosure may be well understood, there are now be described various forms thereof, given by way of example, reference being made to the accompanying drawings, in which:

FIG. 10 is an example of an alarm code generated by an alarm unit; and

DETAILED DESCRIPTION OF EXEMPLARY EMBODIMENTS

Figure 1:
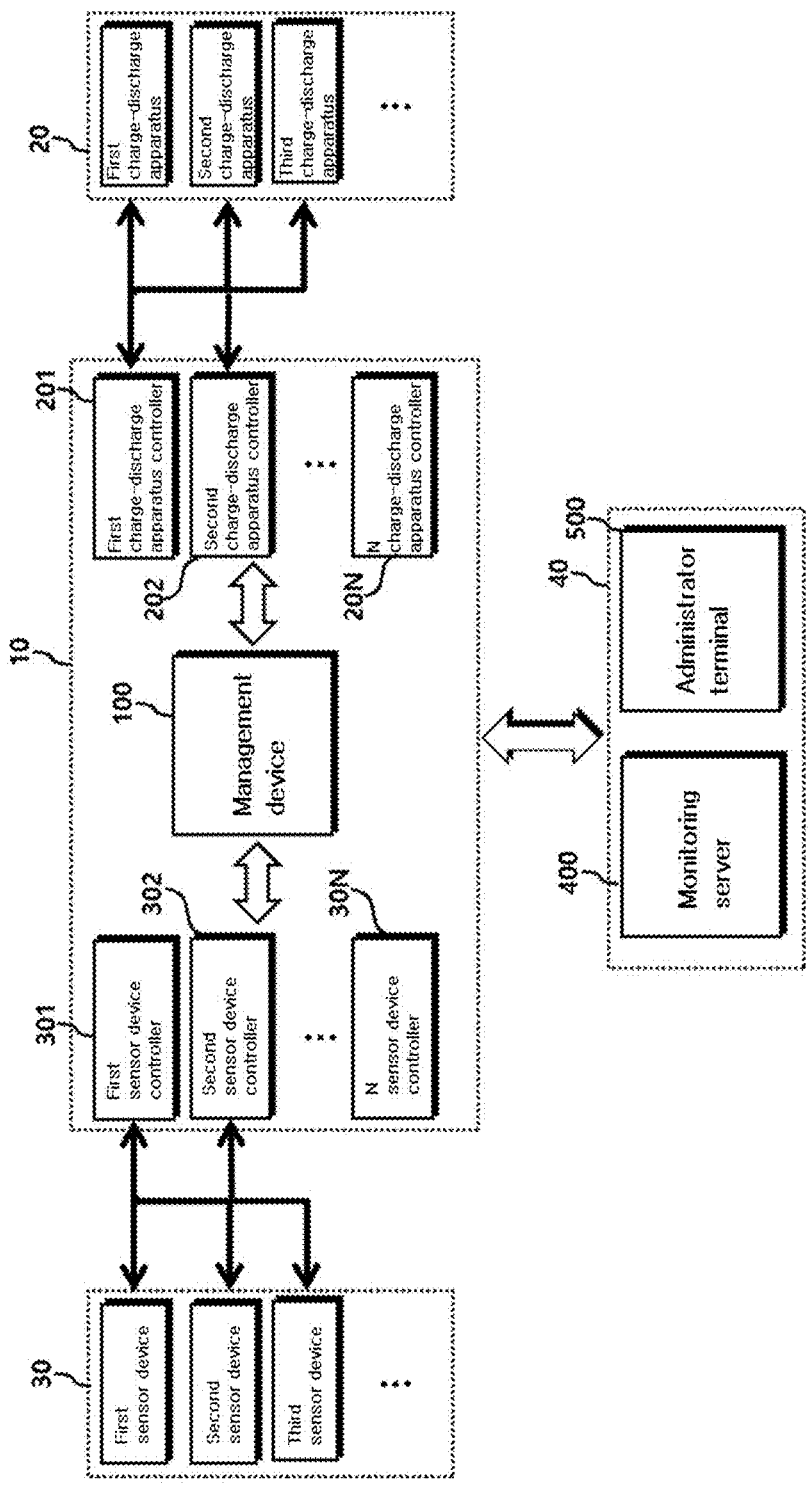
FIG. 1 is an example diagram of a battery monitoring data management system according to an embodiment of the present disclosure.

Hereinafter, embodiments of the present disclosure are described in detail in reference to accompanying drawings. Advantages and characteristics of the present disclosure and methods to achieve them should be more clearly understood by referring to embodiments described in detail below together with accompanying drawings. However, the present disclosure is not limited to the below disclosed embodiments, but may be implemented in various types different from each other. The embodiments are provided only for completing the present disclosure and for completely teaching the scope of the present disclosure to a person having ordinary skill in the art to which the present disclosure pertains. The present disclosure is defined only by the scope of the claims and their equivalents. With regard to the reference numerals of the components of the respective drawings, it should be noted that the same reference numerals are assigned to the same components.

If there is no other definition, all the terms used in this specification (including technological and scientific terms) have meanings that can be commonly understood by persons with ordinary skill in the art to which the present disclosure pertains. In addition, generally used terms defined in dictionaries shall not be ideally or excessively interpreted if they are not clearly and particularly defined such. The terms used in this specification are to explain the embodiments, but not to limit the present disclosure. In this specification, a term in a singular form may also mean a term in a plural form as long as there is no particular indication.

In this specification, a battery monitoring data management method, device, and system may respectively be abbreviated as a monitoring data management method, device, and system.

Additionally, in this specification, a battery may be a battery to be embedded or mounted in an electric vehicle (EV). However, the present disclosure is not limited thereto. That is, a battery according to an embodiment of the present disclosure may not necessarily be a battery for an electric vehicle, but include all the batteries storing electric energy including batteries for energy storage devices.

An electric vehicle may be referred to as an EV or an electric automobile and it should be understood to include a hybrid electric vehicle.

FIG. 1 is an example diagram of a battery monitoring data management system according to an embodiment of the present disclosure.

Referring to FIG. 1, according to an embodiment, components of a monitoring data management system may be divided into multiple groups of functions as follows. Hereinafter, each group may comprise at least one hardware module and one software module operating the hardware module.

A monitoring data management system may comprise a control group 10, a charge-discharge apparatus group 20, a sensor device group 30, and a monitoring data collection group 40.

The control group 10 collects data from multiple charge-discharge apparatuses included in the charge-discharge apparatus group 20, which data corresponds to batteries connected with the respective charge-discharge apparatuses, and generates monitoring data.

Additionally, the control group 10 collects sensing data sensed by multiple sensor devices included in the sensor device group 30, and generates monitoring data.

The control group 10 provides generated monitoring data to the monitoring data collection group 40.

The control group 10 generates and/or analyzes monitoring data based on data sensed and/or measured in the monitoring data management system. For this, each individual component of the control group 10 may comprise at least one processor, and the entire monitoring data management system may be operated through message exchange between the respective individual components.

According to an embodiment, the control group 10 may comprise a monitoring data management device 100, multiple charge-discharge apparatus controllers 201~20N, and multiple sensor device controllers 301~30N. The monitoring data management device 100, multiple charge-discharge apparatus controllers 201~20N, and multiple sensor device controllers 301~30N may be computing devices performing data communication among them through network.

For example, the monitoring data management device 100 may generate monitoring data based on data sensed and/or measured in the monitoring data management system.

The monitoring data management device 100 may analyze generated monitoring data and transfer the monitoring data and/or analyzed results to the monitoring data collection group 40. Specific configuration and operations of the monitoring data management device 100 will be described below regarding embodiments referring to FIG. 2 to FIG. 11.

For another example, at least one charge-discharge apparatus controller 201 among the multiple charge-discharge apparatus controllers may generate monitoring data based on battery data collected in the charge-discharge apparatuses.

According to an embodiment of the present disclosure, the charge-discharge apparatuses in the charge-discharge apparatus group 20 may be apparatuses or facilities for performing processes regarding batteries. Specifically, the charge-discharge apparatuses may include chargers connected with batteries for charging batteries, dischargers to receive current outputs when batteries are discharged, or apparatuses for performing both the charges and discharges.

As an example, a charge-discharge apparatus may be a cycler for testing battery cells. For instance, the charge-discharge apparatuses 20 may be cell cyclers, module cyclers, or pack cyclers. However, embodiments of the present disclosure are not limited thereto.

A charge-discharge apparatus may measure a battery state, such as voltages, currents, temperatures, an average voltage, an average current, an average temperature, the amount of charged power, the amount of discharged power, or the like. Furthermore, a charge-discharge apparatus may measure and/or collect at least one of data measured during charging a battery and data measured during discharging a battery, such as an electrolyte level, information of a battery manufacturer, or information of a main component of a battery.

A first charge-discharge apparatus controller 201 may analyze generated monitoring data and transfer the monitoring data and/or an analysis result to the monitoring data management device 100. The monitoring data management device 100 may receive the monitoring data and transfer it to the monitoring data collection group 40.

The first charge-discharge apparatus controller 201 and a second charge-discharge apparatus controller 202, included in multiple charge-discharge apparatus controllers 201~20N, may perform the same function and control at least one of charge-discharge apparatuses included the charge-discharge apparatus group 20.

Sensor devices in the sensor device group 30 may be mounted in accordance with predetermined rules regarding environments where charge-discharge apparatuses operate, and may comprise at least one sensor for measuring temperatures, humidity, pressure, or specific gases, and for measuring properties of an electric vehicle and/or various outputs when the sensor is mounted inside the electric vehicle.

As an example, a first sensor device controller 301, which is at least one of multiple sensor device controllers, may generate monitoring data based on sensing data collected from the sensor devices. For instance, sensing data collected by the sensor devices may include external temperatures, pressure, information about an electric vehicle on which a battery is mounted, or various data outputted by the electric vehicle, which are not data collected from the battery, but data of an environment where the battery charge and discharge are performed.

The first sensor device controller 301 may analyze generated monitoring data and transfer the monitoring data and/or an analysis result to the monitoring data management device 100. The monitoring data management device 100 may receive the monitoring data and transfer it to the monitoring data collection group 40.

The first sensor device controller 301 and a second sensor device controller 302, included in multiple sensor device controllers 301~30N, may perform the same function and control at least one of sensor devices included the sensor device controller group 30.

The monitoring data collection group 40 may comprise a monitoring server 400 and an administrator terminal 500 of the monitoring data management system.

The monitoring server 400 and/or the administrator terminal 500 may collect and store data received from the monitoring data management device 100 and analyze collected data.

Figure 2:
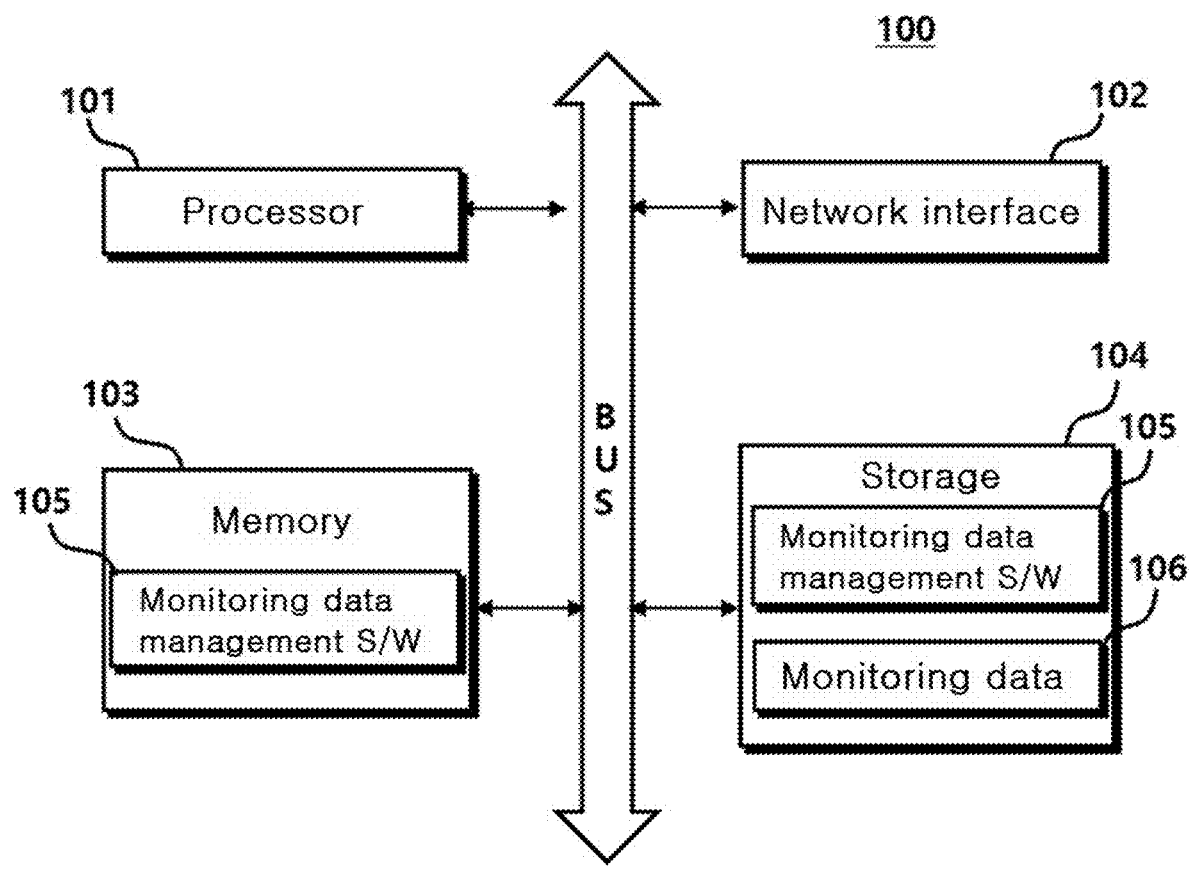
FIG. 2 is a block diagram of a battery monitoring data management device according to another embodiment of the present disclosure.

FIG. 2 is a block diagram of a battery monitoring data management device according to another embodiment of the present disclosure.

Referring to FIG. 2, the monitoring data management device 100 may comprise at least one processor 101, a network interface 102 to perform data communication with at least one device of the monitoring data management system, a memory 103 to load a computer program 105 executed by the processor 101, and a storage 104 to store the computer program 105 and monitoring data 106.

The processor 101 controls overall operations of components of the monitoring data management device 100. The processor 101 may comprise an electronic control unit (ECU), a central processing unit (CPU), a micro processor unit (MPU), a micro controller unit (MCU), an application processor (AP), or a processor of a certain type that is widely known in the technical field of the present disclosure. Additionally, the processor 101 may perform operations with respect to at least one application or program for practicing a method according to embodiments of the present disclosure.

The network interface 102 supports wired or wireless communication of the monitoring data management device 100. Additionally, the network interface 102 may perform data communication with at least one charge-discharge apparatus controller, at least one sensor device controller, at least one charge-discharge apparatus, at least one sensor device, the monitoring server 400, and the administrator terminal 500 of the monitoring data management system.

The network interface 102 may comprise at least one communication module for supporting the wired or wireless communication and/or at least one hardware module for supporting a physical connection.

For example, the network interface 102 may receive signals to control the charge-discharge apparatus group 20 from the monitoring server 400 or the administrator terminal 500 and deliver messages to the charge-discharge apparatus controllers 201~20N. Here, the monitoring server 400 and the administrator terminal 500 may be computing devices that can transmit control messages through TCP/IP, Serial, CAN, or LIN communications, and may comprise, for example, at least one of a PLC, a Window application, and a mobile application.

According to still another embodiment of the present disclosure, the network interface 102 may form an interface with an artificial neural network widely known in the technical field to which the present disclosure belongs.

The memory 103 stores various data, commands and/or information. The memory 103 may load at least one program (105) from the storage 104 to implement the embodiments of the present disclosure. The memory 103 in FIG. 2 may be a random access memory (RAM), for example.

The storage 104 may store the at least one program 105 and monitoring data 106 according to an embodiment of the present disclosure. The monitoring data 106 may include at least one of temperatures, charge amounts, and discharge amounts of batteries of, types of batteries, main components of batteries, data of battery manufacturers, data of electric vehicle properties, data of electric vehicle outputs, data of charge-discharge environments, alarm data, or the like, which is collected from the charge-discharge apparatuses.

The storage 104 may comprise a non-volatile memory, such as a read only memory (ROM), an erasable programmable read only memory (EPROM), an electrically erasable programmable read only memory (EEPROM), a flash memory, or the like, a hard disk, a detachable disk, or a recording medium of a certain form that is widely known in the technical field to which the present disclosure belongs.

In particular, a database (MySQL, PostgreSQL, MariaDB, Microsoft SQL Server, Oracle Database) may be built in the storage 104 and be extended to an external storage space of a Cloud type through the network interface 102.

FIG. 2 discloses monitoring data management software 105 as an example of the at least one program 105. The monitoring data management software 105 may practice a method for managing monitoring data of batteries by the execution of each operation by the processor 101 of the monitoring data management device 100 according to the embodiments of the present disclosure.

The monitoring data management software 105 may comprise at least one functional module for managing monitoring data according to the embodiments of the present disclosure. This will be described below with reference to FIG. 3.

Figure 3:
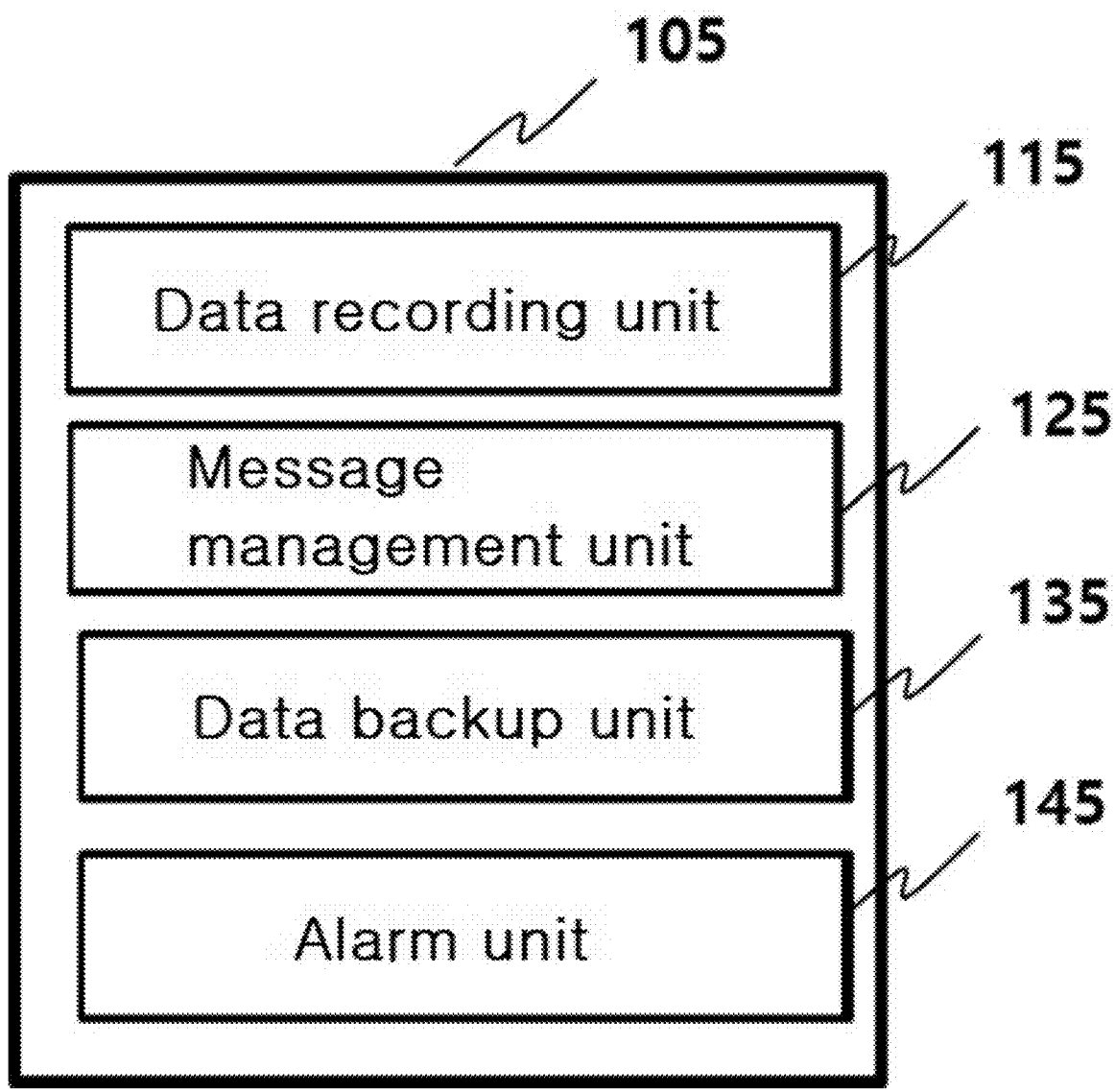
FIG. 3 is a configuration diagram of monitoring data management software to which some embodiments of the present disclosure refer.

FIG. 3 is a configuration diagram of monitoring data management software to which some embodiments of the present disclosure refer.

The term 'unit' in FIG. 3 may indicate a software module of a functional unit forming the monitoring data management software 105, which is a pack of codes operated by the processor 101 for performing a specific function.

Referring to FIG. 3, the monitoring data management software 105 may comprise a data recording unit 115, a message management unit 125, a data backup unit 135, and an alarm unit 145.

The data recording unit 115 may record monitoring data to at least one of a storage space in the storage 104, an external cloud, and the monitoring data collection group 40.

The data recording unit 115 may set a recording path for a recording target of the monitoring data determined in linkage with the message management unit 125.

The message management unit 125 performs service of a distributed message broker. The message broker may act as an intermediator by transferring messages received from a publisher to a subscriber and enable exchange of messages among pieces of application software.

In addition, the message management unit 125 facilitates asynchronous communication among different systems and performs message exchange and processing among the monitoring data control group 10, the charge-discharge apparatus group 20, the sensor device group 30, and the monitoring data collection group 40 in FIG. 1.

Such a function of the message management unit 125 as a message broker is useful, in particular, in a large-scale distributed system.

For example, the message management unit 125 has an advantage of enabling stable communication among different groups and minimizing message loss in an environment where battery test data is collected from multiple charge-discharge apparatuses as in the embodiments of the present disclosure.

For another example, the message management unit 125 can flexibly respond even when applied to a system, requiring load and management of large amounts of data, where an electric vehicle charger (EVSE) is directly connected with electric vehicle batteries and battery state data during charging is collected, or to a system bearing a possibility that targets for message exchange are extended as in a case where electric vehicle chargers are additionally built. This leads to maximizing efficiency in data management.

A space where large amounts of data are loaded is referred to as a message queue and multiple messages may form groups in the message queue. Such a group of messages is referred to as a topic.

A message group may generate a name that a message publisher desires.

As an example, names of message groups of the present disclosure may be generated by an individual one of the charge-discharge apparatus group 20, the sensor device group 30, the charge-discharge apparatus controllers 201~20N, and the sensor device controllers 301~30N.

As another example, names of message groups of the present disclosure may also be generated by the monitoring server 400 and/or the administrator terminal 500. In this case, the monitoring server 400 and/or the administrator terminal 500 may generate control commands, for controlling the charge-discharge apparatus group 20, the sensor device group 30, the charge-discharge apparatus controllers 201~20N, and the sensor device controller 301~30N, as messages.

The data backup unit 135 may verify responses from the charge-discharge apparatus controllers 201~20N and the sensor device controllers 301~30N and determine whether the charge-discharge apparatus controllers normally collect battery state data of the charge-discharge apparatuses and if the sensor device controllers normally collect environment data of the sensor devices. When the data collections of the charge-discharge apparatus controllers and/or the sensor device controllers in operation are not normal, the data backup unit 135 may select a charge-discharge apparatus controller and/or a sensor device controller for performing a backup function.

As an example, the data backup unit 135 may verify the reception of messages corresponding to the normal data collection, stop control for the charge-discharge apparatuses of the first charge-discharge apparatus controller 201 that does not respond, and give control authority for the charge-discharge apparatuses to the second charge-discharge apparatus controller 202.

As another example, the data backup unit 135 may verify the reception of messages corresponding to the normal data collection, stop control for the sensor devices of the first sensor device controller 301 that does not respond, and give control authority for the sensor devices to the second sensor device controller 302.

The alarm unit 145 may extract alarm data by searching for targets for alarm in the message groups. The alarm unit 145 may generate alarm messages based on the extracted alarm data. The alarm unit 145 may transfer the alarm messages to a storage path designated by the data recording unit 115 through the network interface 102. Here, the alarm unit 145 may check for duplication of alarm data before transferring alarm message and transfer an alarm message if there is no duplication problem.

The designated storage path may become multiple. The alarm unit 145 may transfer alarm messages to multiple subscribers.

Figure 4:
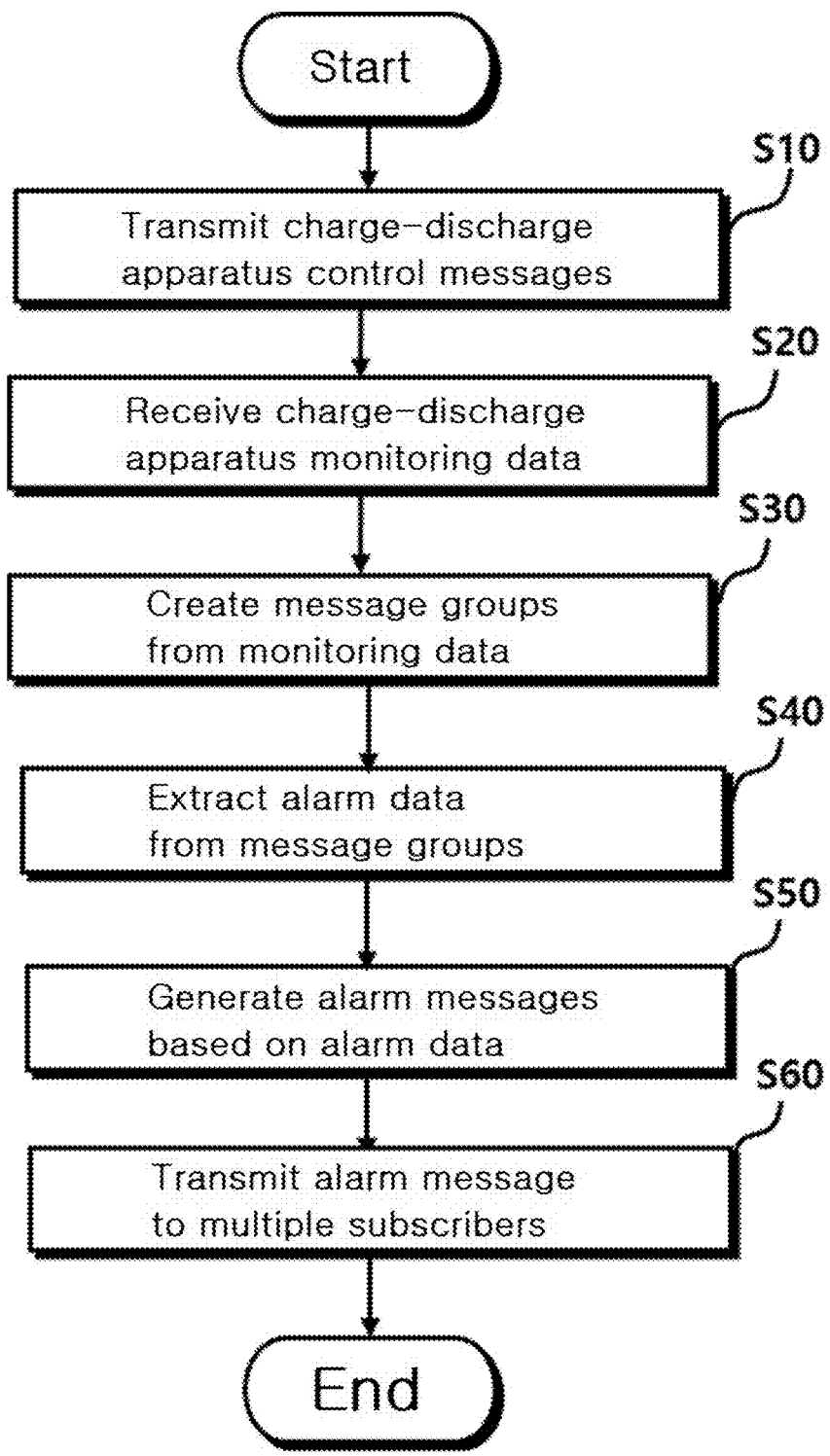
FIG. 4 is a flow diagram of a battery monitoring data management method according to still another embodiment of the present disclosure.

FIG. 4 is a flow diagram of a battery monitoring data management method according to still another embodiment of the present disclosure. Each step in FIG. 4 is performed by the monitoring data management device 100. Specifically, the processor 101 of the monitoring data management device 100 operates the monitoring data management software 105, enabling each step to be performed.

Figure 5:
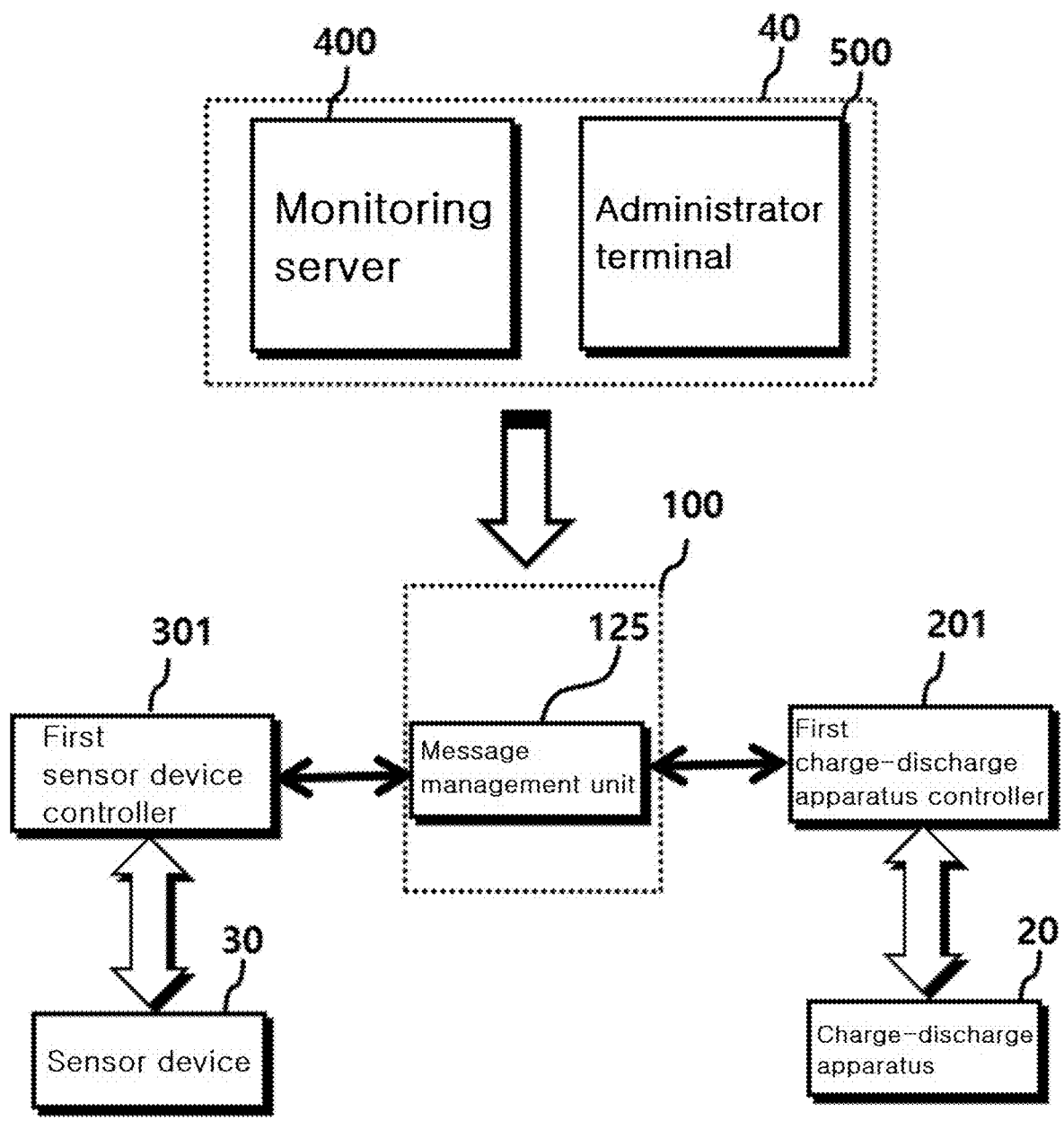
FIG. 5 is an example diagram of a control operation of a monitoring data management device according to some embodiments of the present disclosure.

FIG. 5 is an example diagram of a control operation of a monitoring data management device according to some embodiments of the present disclosure.

Referring to FIG. 4, the monitoring data management device 100 may transfer a charge-discharge apparatus control message to at least one charge-discharge apparatus controller 201~20N (S10).

According to an embodiment of the present disclosure, in a step S10, the monitoring data management device 100 may also transfer a sensor device control message to at least one sensor device controller 301~30N.

Referring to FIG. 5, for example, the monitoring data management device 100 transfers a charge-discharge apparatus control message to the charge-discharge apparatus controller 201. The charge-discharge apparatus controller 201 controls operations of at least one charge-discharge apparatus belonging to the charge-discharge apparatus group 20 based on the received charge-discharge apparatus control message.

For another example, the monitoring data management device 100 transfers a sensor device control message to the sensor device controller 301. The sensor device controller 301 controls operations of at least one sensor device belonging to the sensor device group 30 based on the received sensor device control message.

In one embodiment, the charge-discharge apparatus control message and the sensor device control message may be generated and managed by the message management unit 125.

In another embodiment, the charge-discharge apparatus control message and the sensor device control message may be generated in the control group 40. Specifically, this message may be generated in the monitoring server 400 and/or the administrator terminal 500 and transferred to the monitoring data management device 100. In this case, the transferred control message may be classified by the message management unit 125 and message groups may be created based on classified messages.

For example, a charge-discharge apparatus control message may include all commands for controlling a charge-discharge apparatus, such as commands for the start of charge or discharge operation, the stop of an operation, the start of a reserved operation, the change of reservation, the transmission of a battery test operation recipe, the setting of charge input power depending on simulation types, or the like. A sensor device control message may include all commands for controlling a sensor device, such as commands for the activation of a sensor device, a linked sensing of multiple sensor devices, the filtering of sensor device measurement values, the operation of a sensor device based on a battery test operation recipe, the calibration of measurement values depending on simulation types, or the like.

Referring to FIG. 4 again, the monitoring data management device 100 may receive, from the charge-discharge apparatus controller 201, monitoring data of battery state information, received from the charge-discharge apparatus group 20, as messages (S20). Additionally, the monitoring data management device 100 may also receive, from the sensor device controller 301, monitoring data of battery charge-discharge environment information, received from the sensor device group 30, as messages.

The monitoring data management device 100 may create message groups from the received monitoring data (S30).

In another embodiment, the monitoring data management device 100 may also generate monitoring data based on the received state information and environment information.

Figure 6:
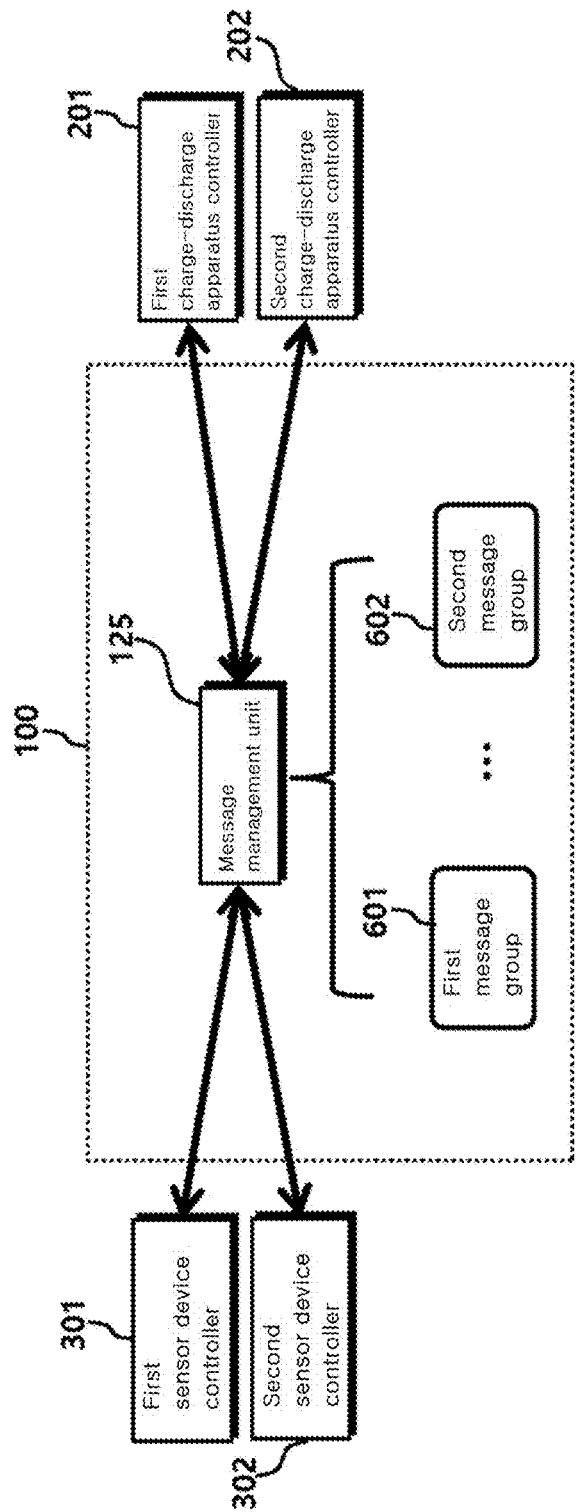
FIG. 6 is an example for illustrating a message group managing operation of a message managing unit to which some embodiments of the present disclosure refer.

FIG. 6 is an example for illustrating a message group managing operation of a message managing unit to which some embodiments of the present disclosure refer.

Referring to FIG. 6, the first charge-discharge apparatus controller 201 and the second charge-discharge apparatus controller 202 respectively receive monitoring data from their corresponding charge-discharge apparatuses, each of which is a target for control of the relevant controller, and transfer the monitoring data to the message management unit 125 as messages. The message management unit 125 may group messages received from a charge-discharge apparatus controller to create a message group 601.

According to an embodiment, the message group 601 may include at least one sub message group. Sub message groups may be classified based on various state information within predetermined ranges regarding various factors, such as battery test targets, dates, times, electric vehicles equipped with batteries, battery test recipes, charge amounts, simulation types, discharge amounts, average power amounts, or the like. Names of sub message groups may be determined by the relevant charge-discharge apparatus controllers and/or the respective charge-discharge apparatuses in the charge-discharge apparatus group 20.

As a first example, a first sub message group included in the sub message groups may include battery state information collected from a predetermined charge-discharge apparatus.

As a second example, a second sub message group included in the sub message groups may include state information of battery cells of a specific manufacturer.

As a third example, a third sub message group included in the sub message groups may include battery test results on a specific date.

As a fourth example, a fourth sub message group included in the sub message groups may include battery state information of a specific vehicle.

As a fifth example, a fifth sub message group included in the sub message groups may include messages classified based on a predetermined classification reference for alarm targets among battery state information.

Messages included in the sub message groups according to the embodiments of the present disclosure are not limited to the above-described examples.

In addition, the first sensor device controller 301 and the second sensor device controller 302 respectively receive monitoring data from their corresponding sensor devices, each of which is a target for control of the relevant controller, and transfer the monitoring data to the message management unit 125 as messages. The message management unit 125 may group messages received from a sensor device controller to create a message group 602.

According to another embodiment, the message group 602 may include at least one sub message group. Sub message groups may be classified based on various state information within predetermined ranges regarding various factors, such as battery test dates, times, temperatures, air environments, properties of electric vehicles equipped with batteries, output data of electric vehicles such as vibrations, battery test recipes, simulation types, or the like. Names of sub message groups may be determined by the relevant sensor device controllers and/or the respective sensor devices in the sensor device group 30.

As a first example, a first sub message group included in the sub message groups may include measurement state information collected from a predetermined sensor device.

As a second example, a second sub message group included in the sub message groups may include environment information of charge-discharge tests for battery cells of a specific manufacturer.

As a third example, a third sub message group included in the sub message groups may include environment information during battery tests on a specific date.

As a fourth example, a fourth sub message group included in the sub message groups may include electric vehicle properties and/or electric vehicle output environment information during battery tests for a specific vehicle.

As a fifth example, a fifth sub message group included in the sub message groups may include messages classified based on a predetermined classification reference for alarm targets among environment information of battery tests.

Messages included in the sub message groups according to the embodiments of the present disclosure are not limited to the above-described examples.

Referring to FIG. 4 again, the monitoring data management device 100 may extract alarm target messages from a first message group 601 and a second message group 602 (S40). The monitoring data management device 100 may search for messages in sub message groups of the first and second message groups 601, 602, and extract specific alarm data. For example, messages of the sub message groups may include battery state information and environment information, and the message management unit 125 may extract alarm data based on a predetermined selection reference for alarm target messages.

Figure 7:
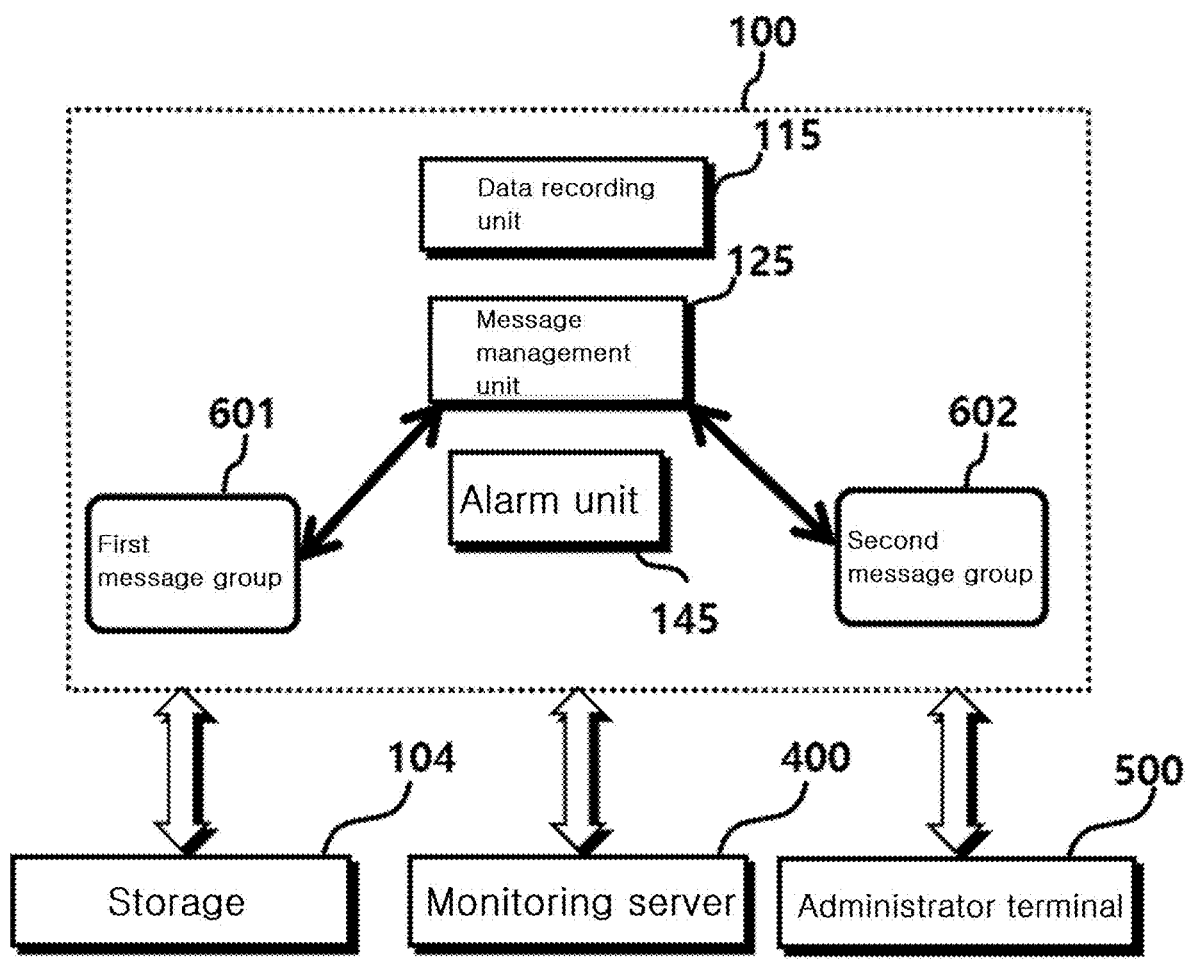
FIG. 7 is an example for illustrating a storage operation of a monitoring data management device to which some embodiments of the present disclosure refer.

FIG. 7 is an example for illustrating a storage operation of a monitoring data management device to which some embodiments of the present disclosure refer.

Referring to FIG. 7, when the message management unit 125 extracts alarm data from the message group 601 and the message group 602, at least one of the message management unit 125 and the data recording unit 115 may identify a predetermined code of the alarm data. The data recording unit 115 may designate a data storage path based on the identified code.

Referring to FIG. 4 again, the alarm unit 145 may generate an alarm message based on the alarm data (S50).

The alarm unit 145 may transfer the generated alarm message to the designated storage path. The alarm message may include alarm target state information included in the alarm data, and the alarm unit 145 may determine a subscriber of the alarm data based on a predetermined problem level matched with the alarm target state information. The alarm unit 145 may generate an alarm message corresponding to the determined subscriber. The alarm message may be formed with interfaces different from each other depending on subscribers.

Then, the monitoring data management device 100 may transfer the alarm message to multiple subscribers (S60). Referring to FIG. 7, the alarm message may be transferred to at least one subscriber, which is one of the storage 104 of the monitoring data management device 100, the monitoring server 400, and the administrator terminal 500 according to the designated path of the data recording unit 115.

Such a method of sharing data by various paths by transferring alarm messages to multiple subscribers as described above has an advantage of preventing data loss in a problematic situation in comparison with a management method where data is collected in serial paths.

Specifically, in methods where data is collected in serial paths, such as when monitoring data is collected solely by charge-discharge apparatuses, when monitoring data is collected by charge-discharge apparatus controllers, when a monitoring server 400 collect monitoring data received from charge-discharge apparatuses, or the like, there could be problems. In a problematic situation such as a certain equipment failure in a path, monitoring data cannot be transferred to final subscribers or data can be lost in the failure equipment in the path.

According to the embodiments of the present disclosure, data is transferred to the storage 104 of the data management device 100, the monitoring server 400, and the administrator terminal 500 in parallel, and the transferred alarm messages adhere to interfaces of their respective subscribers. This results in enhanced efficiency in data management.

According to another embodiment, the message management unit 125 and/or the alarm unit 145 may control an alarm message generation process such that alarm data is transferred only to a specific subscriber, and not to the rest of the subscribers according to a predetermined criterion.

Figure 8:
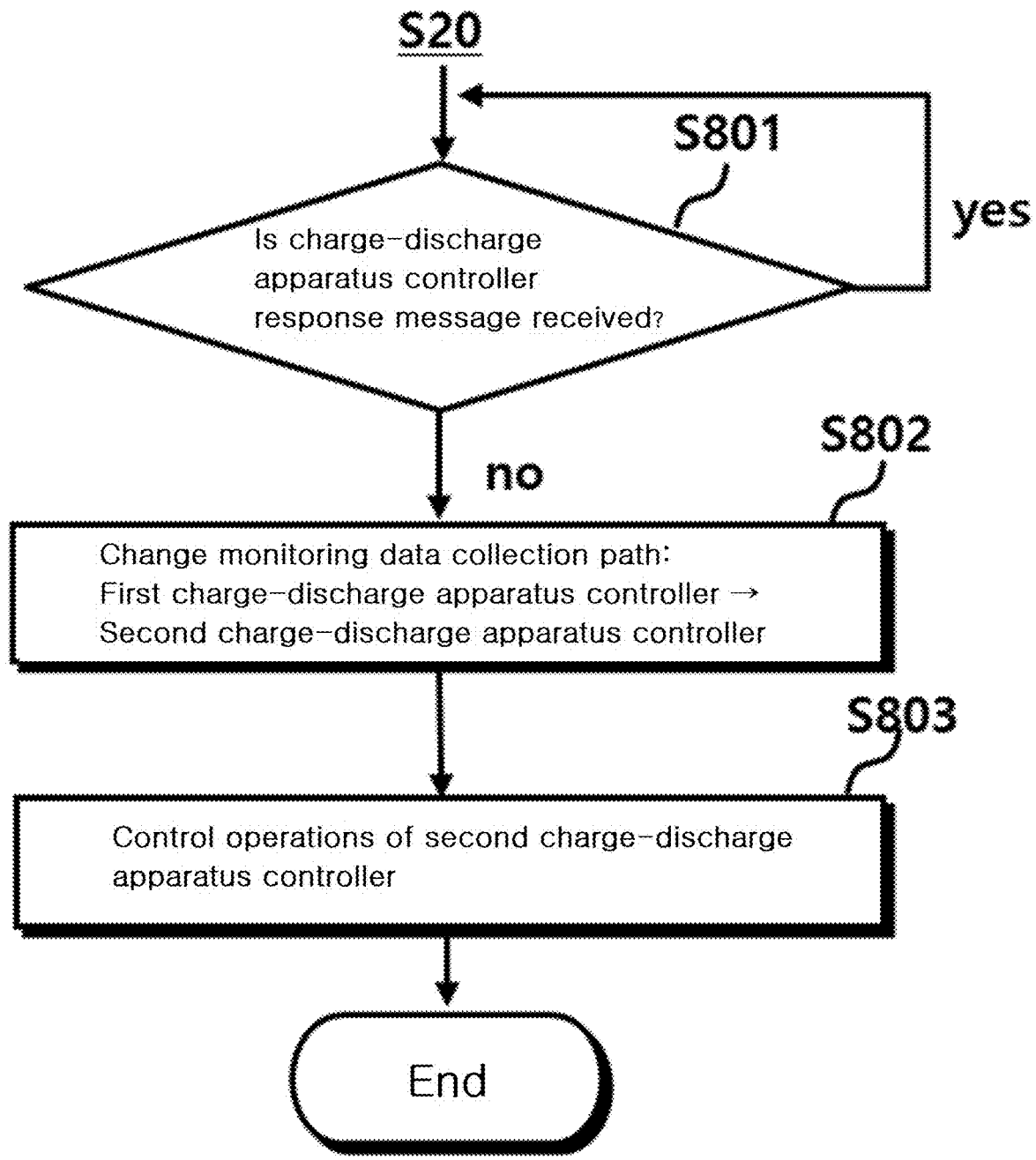
FIG. 8 is a flow diagram for illustrating a backup operation of a data backup unit to which some embodiments of the present disclosure refer.

FIG. 8 is a flow diagram for illustrating a backup operation of a data backup unit to which some embodiments of the present disclosure refer.

Referring to FIG. 8, in the step S20 in FIG. 4, the monitoring data management device 100 may determine whether monitoring data is received.

In particular, the monitoring data management device 100 determines whether the charge-discharge apparatus controllers are activated, to prevent the loss of monitoring data. For this, the monitoring data management device 100 may determine whether response messages are received from the charge-discharge apparatus controllers (S801). For example, referring to FIG. 6, if no response message is received from the first charge-discharge apparatus controller 201, the monitoring data management device 100 may deprive control authority for a target charge-discharge apparatus from the first charge-discharge apparatus controller 201 and give it to the second charge-discharge apparatus controller 202 (S802).

That is, in a case when state information of a battery cell is received from a control target charge-discharge apparatus and monitoring data is not generated in or transferred from the first charge-discharge apparatus controller 201, the monitoring data management device 100 may change a path for collecting monitoring data so that information received from the control target charge-discharge apparatus is managed by the second charge-discharge apparatus controller 202.

Then, the monitoring data management device 100 may control operations of the second charge-discharge apparatus controller 202 (S803). By the control of the monitoring data management device 100, the second charge-discharge apparatus controller 202 may generate monitoring data. In addition, under the control of the monitoring data management device 100, the second charge-discharge apparatus controller 202, instead of the first charge-discharge apparatus controller 201, may control operations of a control target charge-discharge apparatus.

Figure 9:
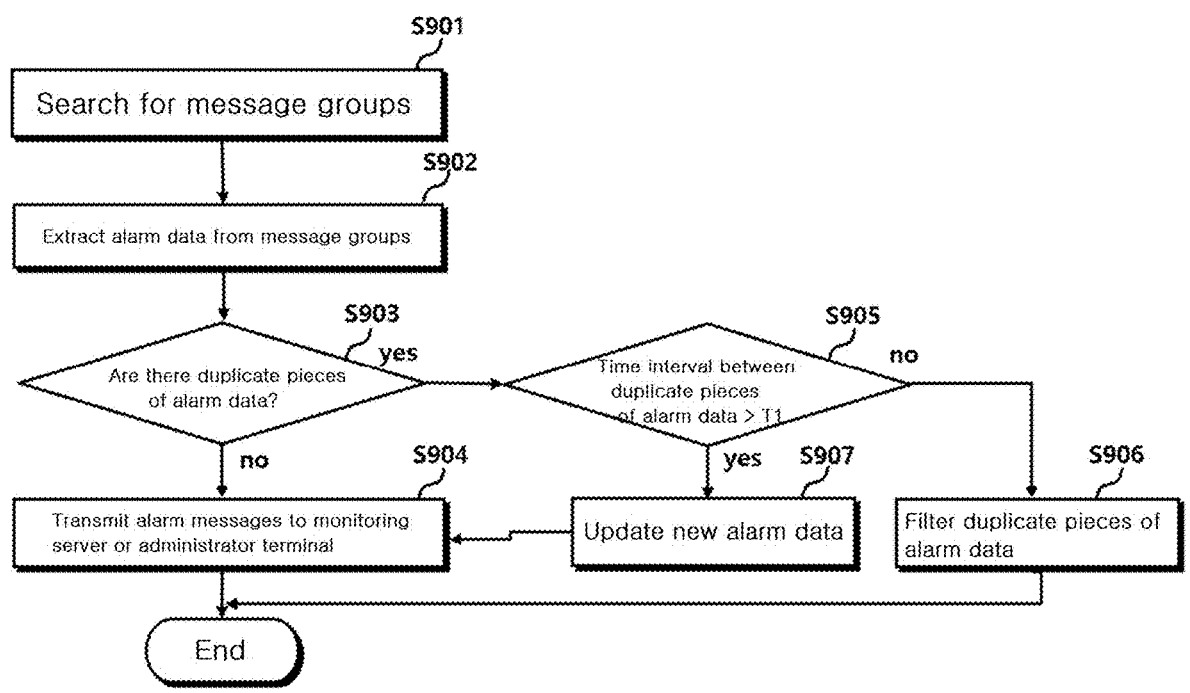
FIG. 9 is an example for illustrating a duplicate alarm filtering function of an alarm unit to which some embodiments of the present disclosure refer.

FIG. 9 is an example for illustrating a duplicate alarm filtering function of an alarm unit to which some embodiments of the present disclosure refer, and FIG. 10 is an example of an alarm code generated by an alarm unit.

Referring to FIG. 9, the monitoring data management device 100 may search for data in the message groups (S901) and extract alarm data therefrom (S902).

The monitoring data management device 100 may determine whether duplicate data exists in the alarm data (S903). When collecting battery test data from multiple charge-discharge apparatuses, the collected data amount becomes massive, and when generating and transferring an alarm message every time where alarm data is generated, this results unnecessarily in waste of resources. In order to prevent such a case, the monitoring data management device 100 may filter duplicate alarm data and process, one time, data having sameness into one alarm message to transmit it.

According to an embodiment, if there exist duplicate pieces of alarm data, the monitoring data management device 100 may identify time intervals between collections of duplicate pieces of alarm data. The monitoring data management device 100 may determine whether the identified time intervals exceed a predetermined first threshold value T1 (S905).

When the duplicate pieces of alarm data are collected at a time interval within the first threshold value, the monitoring data management device 100 identifies them as the same alarm data and filters out the duplicate pieces of alarm data, retaining only one piece (S906).

For example, the duplicate pieces of alarm data, which have been filtered out, may be stored in the storage 104 of the monitoring data management device 100 during a predetermined period of time.

For another example, the duplicate pieces of alarm data, which have been filtered out, may be stored in a storing space of a charge-discharge apparatus controller or a sensor device controller during a predetermined period of time.

When there is no remaining piece of alarm data after filtering out the duplicate pieces of alarm data or there are no duplicate pieces, the monitoring data management device 100 may generate an alarm message based on the alarm data and transmit it to the monitoring server 400 and/or the administrator terminal 500 (904).

According to another embodiment, when the duplicate pieces of alarm data are collected, for example, at a time interval exceeding the first threshold value, the monitoring data management device 100 may determine that a specific problem does not temporarily occur, but rather it repeats or it continues, and classify this alarm data as a new type (S907).

In other words, when first alarm data is collected, the monitoring data management device 100 may classify this alarm data as alarm data for a first problematic situation and may generate and transfer an alarm message. Then, when duplicate alarm data is collected at a time interval exceeding the first threshold value, the monitoring data management device 100 may classify this alarm data for a second problematic situation, which differs from the first problematic situation, and may generate and transfer a new alarm message.

As an example, time intervals between collections of alarm data may be classified as a second threshold value period in addition to the first threshold value period, and a specific alarm data may be immediately deleted without being stored.

As another example, a specific alarm data related to the second threshold value period may be transferred only to the monitoring server 400 and may not be transferred to the administrator terminal 500.

Referring to FIG. 10, alarm data may be a table comprising an equipment number 1001, a channel number 1002, and an alarm code 1003 as shown in FIG. 10.

For example, the alarm unit 145 may additionally include state information of a battery cell in the table.

For another example, in case of duplicate alarm data, the table may comprise a time interval between collections, a number of duplications, information of a storage path designated by the data recording unit 115.

Figure 11:
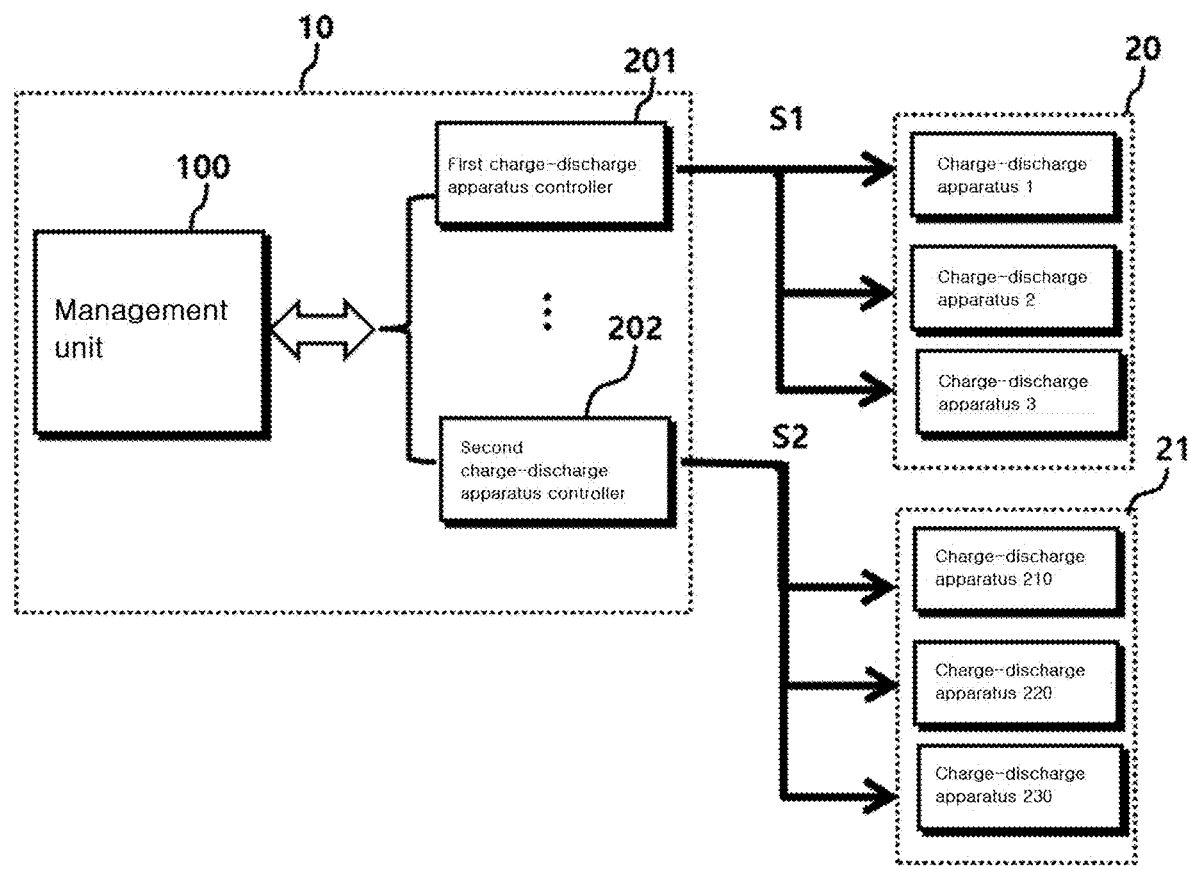
FIG. 11 is an example for illustrating simulation control operations over charge-discharge apparatuses of a monitoring data management device to which still another embodiment of the present disclosure refers.

FIG. 11 is an example for illustrating simulation control operations over charge-discharge apparatuses of a monitoring data management device to which still another embodiment of the present disclosure refers.

Thus far, the embodiments, in which the monitoring data management device 100 collects state information of battery cells or environment information measured by the charge-discharge apparatuses and the sensor devices respectively controlled by the charge-discharge apparatus controllers and the sensor device controllers, were described. The embodiments of the present disclosure are not limited thereto. The monitoring data management device 100 may also test battery cells by controlling the charging power and charge-discharge environment according to a specific scenario.

For example, in order to charge electric vehicle A, when charging power outputted from a charger is transmitted through a connector through a connector to electric vehicle A and to a battery of electric vehicle A, the charging power may vary along the sequence of the start, proceeding, and end of charge. Electric vehicle B may have characteristics different from those of electric vehicle A. That is, battery state information during charge may be different depending on types of electric vehicles.

For another example, components forming a battery cell are different depending on battery manufacturers, and this results in various aspects in state information characteristics when charging or discharging a battery.

Accordingly, in order to collect various aspects of state information, the monitoring data management device 100 may implement battery test recipes for charge-discharge simulations based on various factors, such as types of electric vehicles, battery manufacturers, environments where batteries are, characteristics of drivers, output power characteristics depending on charge-discharge apparatus types, characteristics depending on charging time periods.

Referring to FIG. 11, the monitoring data management device 100 may determine control targets that the first charge-discharge apparatus controller 201 and the second charge-discharge apparatus controller 202 will control. That is, the monitoring data management device 100 may assign control authority for multiple charge-discharge apparatuses to any one of the first charge-discharge apparatus controller 201 and the second charge-discharge apparatus controller 202.

FIG. 11 shows an example in which control authority for charge-discharge apparatus 1, charge-discharge apparatus 2, and charge-discharge apparatus 3 in a charge-discharge apparatus group 20 is assigned to the first charge-discharge apparatus controller 201 and charge-discharge apparatus 210, charge-discharge apparatus 220, and charge-discharge apparatus 230 in a charge-discharge apparatus group 21 is assigned to the second charge-discharge apparatus controller 202.

In the previous embodiments, only one of the first charge-discharge apparatus controller 201 and the second charge-discharge apparatus controller 202 has control authority for charge-discharge apparatuses and the other performs a backup function. However, this embodiment illustrates a case where both the first charge-discharge apparatus controller 201 and the second charge-discharge apparatus controller 202 respectively have control authorities to obtain numerous simulation results.

The monitoring data management device 100 may transfer first simulation data S1 to the first charge-discharge apparatus controller 201 so that the first charge-discharge apparatus controller 201 may control a relevant charge-discharge apparatus to test a connected battery with a recipe based on the first simulation data S1.

The monitoring data management device 100 may transfer second simulation data S2 to the second charge-discharge apparatus controller 202 so that the second charge-discharge apparatus controller 202 may control a relevant charge-discharge apparatus to test a connected battery with a recipe based on the second simulation data S2.

According to the embodiments of the present disclosure, since the monitoring data management device 100 controls the charge-discharge apparatus controllers in parallel, the inconvenience of installing simulation data every time when a test for each charge-discharge apparatus or each charge-discharge apparatus controller is required may be resolved. That is, when the monitoring data management device 100 receives simulation data reflecting a recipe for a new test from the monitoring server 400 or the administrator terminal 500, the monitoring data management device 100 may selectively transmit the simulation data to at least one of the charge-discharge apparatus controllers or to at least one of the sensor device controllers and control them so as to easily obtain multiple test data.

In another embodiment, the monitoring data management device 100 may generate various virtual test data by updating various simulation data in the first sensor device controller 301 and the second sensor device controller 302. Specifically, by simulation data applied to the first sensor device controller 301 and the second sensor device controller 302, the sensor devices connected to the sensor device controllers are controlled, measurement values are calibrated, and multiple sensor devices are controlled by being linked, resulting in generation of various test data.

A device and/or decisions of a system and/or operation methods according to the embodiments of the present disclosure described in reference to the accompanying drawings may be implemented by execution of computer programs formed of computer-readable codes. The aforementioned computer programs may be transmitted from a first computing device to a second computing device through a network, such as internet, and installed in the second computing device so the computer programs can be used in the second computing device. The first computing device and the second computing device may comprise stationary computing devices, such as server devices, desktop PCs, or the like, and mobile computing devices, such as notebook computers, smartphones, tablet PCs, or the like.

Although the embodiments of the present disclosure have been described with reference to the accompanying drawings, those having ordinary skill in the art, to which the present disclosure pertains, should understand that the present disclosure can be implemented in other specific ways without changing its technological concept or essential characteristics. Therefore, the embodiments described above should be understood in all respects as illustrative purpose, not limitative.

LIST OF REFERENCE NUMBERS

10: Control group
20: Charge-discharge apparatus group
30: Sensor device group
40: Monitoring data collection group
100: Monitoring data management device
101: Processor
102: Network interface
103: Memory
104: Storage
105: Monitoring data management software
106: Monitoring data
201: First charge-discharge apparatus controller
301: First sensor device controller
400: Monitoring server
500: Administrator terminal
601: First message group
602: Second message group

What is claimed is:

1. A battery monitoring data management system, comprising:
  charge-discharge apparatuses to be connected to batteries and to collect state information of the batteries;
  charge-discharge apparatus controllers to control the charge-discharge apparatuses and to generate monitoring data from the collected state information;
  sensor devices to be installed in an environment for battery tests and to collect battery test environment information;
  sensor device controllers to control the sensor devices and to generate monitoring data from the collected environment information; and
  a monitoring data management device
    to transmit a control message for collecting the state information of batteries to a first charge-discharge apparatus controller and to control the first charge-discharge apparatus controller that operates by the control message, wherein the first charge-discharge apparatus controller collects first state information and second state information of a battery for measurement from at least one charge-discharge apparatus and generates state monitoring data corresponding to the first state information and state monitoring data corresponding to the second state information,
   to transmit a control message for collecting the test environment information of batteries to a first sensor device controller and to control the first sensor device controller that operates by the control message, wherein the first sensor device controller collects first environment information and second environment information of a battery for measurement from at least one sensor device and generates environment monitoring data corresponding to the first environment information and environment monitoring data corresponding to the second environment information,
   to receive the state monitoring data and the environment monitoring data and to create one or more message groups based on the received state monitoring data and the received environment monitoring data,
   to extract alarm data from the created one or more message groups according to a predetermined criterion, when there exist any duplicate pieces of alarm data among the extracted alarm data, to generate an alarm message based on a first piece of alarm data, and to transmit the generated alarm message to at least one of a monitoring server and an administrator terminal,
  wherein the monitoring data management device determines whether a time interval between the reception of the first piece of alarm data and the reception of a second piece of alarm data, among the duplicate pieces of alarm data, exceeds a predetermined threshold value, and, when the time interval exceeds the predetermined threshold value, classifies the second piece of alarm data as new alarm data, generates an alarm message based on the second piece of alarm data, and transmits the generated alarm message to at least one of the monitoring server and the administrator terminal.

2. The battery monitoring data management system of claim 1, wherein names of the message groups are generated by at least one of the charge-discharge apparatus controllers, the charge-discharge apparatuses, the sensor device controllers, and the sensor devices.

3. The battery monitoring data management system of claim 1, wherein the monitoring data management device determines whether a time interval between the reception of the first piece of alarm data and the reception of a second piece of alarm data, among the duplicate pieces of alarm data, exceeds a predetermined threshold value, and, when the time interval does not exceed the predetermined threshold value, filters the second piece of alarm data as duplicate alarm data and stores an alarm message, generated based on the duplicate alarm data, in the monitoring data management device or transmits it only to the monitoring server.

4. The battery monitoring data management system of claim 1, wherein the monitoring data management device generates an alarm message based on the first piece of alarm data, wherein the monitoring data management device identifies a predetermined code in the first piece of alarm data, designates a storage path for the alarm data based on the identified code, and transmits the generated alarm message to at least one of the monitoring server and the administrator terminal based on the designated storage path.

5. The battery monitoring data management system of claim 1, wherein, when transmitting a control message for collecting the state information of batteries to a first charge-discharge apparatus controller, and then, not receiving any response message from the first charge-discharge apparatus controller, the monitoring data management device changes a path for collecting state information by changing control authority for the charge-discharge apparatuses, that collect battery state information, from the first charge-discharge apparatus controller to a second charge-discharge apparatus controller.

6. The battery monitoring data management system of claim 1, wherein, when transmitting a control message for collecting the battery test environment information to a first sensor device controller, and then, not receiving any response message from the first sensor device controller, the monitoring data management device changes a path for collecting environment information by changing control authority for the sensor devices, that collect battery test environment information, from the first sensor device controller to a second sensor device controller.

7. The battery monitoring data management system of claim 1, wherein the monitoring data management device classifies the charge-discharge apparatuses into a first charge-discharge apparatus group and a second charge-discharge apparatus group and transmits first simulation data for virtual tests for batteries connected with the first charge-discharge apparatus group to a first charge-discharge apparatus controller, among the charge-discharge apparatus controllers, that controls the first charge-discharge apparatus group and second simulation data for virtual tests for batteries connected with the second charge-discharge apparatus group to a second charge-discharge apparatus controller, among the charge-discharge apparatus controllers, that controls the second charge-discharge apparatus group.

8. The battery monitoring data management system of claim 7, further comprising at least one of the monitoring server and the administrator terminal, wherein the monitoring data management device receives the first simulation data and the second simulation data from at least one of the monitoring server and the administrator terminal.

9. A monitoring data management method, performed by a battery monitoring data management device, comprising steps of:
   transmitting a control message for collecting state information of batteries to a first charge-discharge apparatus controller and transmitting a control message for collecting battery test environment information to a first sensor device controller;
   collecting, from the first charge-discharge apparatus controller, first state information and second state information of batteries measured by charge-discharge apparatuses controlled by the first charge-discharge apparatus controller;
   collecting, from the first sensor device controller, first environment information and second environment information of batteries for measurement by sensor devices controlled by the first sensor device controller;
   generating state monitoring data based on the first state information and state monitoring data based on the second state information and generating environment monitoring data corresponding to the first environment information and environment monitoring data corresponding to the second environment information;
   creating one or more message groups based on the state monitoring data and the environment monitoring data;
   extracting alarm data from the one or more message groups according to a predetermined criterion;

when there exist any duplicate pieces of alarm data among the extracted alarm data, generating an alarm message based on a first piece of alarm data among the duplicate pieces of alarm data; and transmitting the alarm message to at least one of a monitoring server and an administrator terminal, wherein the step of generating an alarm message based on a first piece of alarm data comprises a step of determining whether a time interval between the reception of the first piece of alarm data and the reception of a second piece of alarm data, among the duplicate pieces of alarm data, exceeds a predetermined threshold value, and, when the time interval exceeds the predetermined threshold value, classifying the second piece of alarm data as new alarm data, wherein the step of transmitting the alarm message to at least one of a monitoring server and an administrator terminal comprises a step of generating an alarm message based on the second piece of alarm data and transmitting the generated alarm message to at least one of the monitoring server and the administrator terminal.

10. A monitoring data management device, comprising:

at least one processor;

a network interface to collect state information of batteries;

a memory to load a computer program executed by the processor; and a storage to store the computer program and monitoring data, wherein the computer program comprises:

an operation of transmitting a control message for collecting state information of batteries to a first charge-discharge apparatus controller and transmitting a control message for collecting environment information of battery tests to a first sensor device controller;

an operation of collecting, from the first charge-discharge apparatus controller, first state information and second state information of batteries measured by charge-discharge apparatuses controlled by the first charge-discharge apparatus controller;

an operation of collecting, from the first sensor device controller, first environment information and second environment information during tests of batteries measured by sensor devices controlled by the first sensor device controller;

an operation of generating state monitoring data based on the first state information and state monitoring data base on the second state information and generating environment monitoring data corresponding to the first environment information and environment monitoring data corresponding to the second environment information;

an operation of creating one or more message groups based on the state monitoring data and the environment monitoring data;

an operation of extracting alarm data from the created one or more message groups according to a predetermined criterion;

an operation of, when there exist any duplicate pieces of alarm data among the extracted alarm data, generating an alarm message based on a first piece of alarm data among the duplicate pieces of alarm data; and an operation of transmitting the alarm message to at least one of a monitoring server and an administrator terminal, wherein the operation of generating an alarm message based on a first piece of alarm data comprises an operation of determining whether a time interval between the reception of the first piece of alarm data and the reception of a second piece of alarm data, among the duplicate pieces of alarm data, exceeds a predetermined threshold value, and, when the time interval exceeds the predetermined threshold value, classifying the second piece of alarm data as new alarm data, wherein the operation of transmitting the alarm message to at least one of a monitoring server and an administrator terminal comprises an operation of generating an alarm message based on the second piece of alarm data and transmitting the generated alarm message to at least one of the monitoring server and the administrator terminal.

* * * * *